「United States Patent [19]
Consolazio et al.

[11] Patent Number: 6,057,740
[45] Date of Patent: May 2, 2000

[54] LOCAL OSCILLATOR SYSTEM USING HARMONIC DERIVED FROM PHASE LOCKED LOOP

[75] Inventors: Stephen James Consolazio, Arlington Heights; Dave Biscan, Mundelein; Albert Ferek, Wood Dale, all of Ill.

[73] Assignee: Northrop Grumman Corporation, Los Angeles, Calif.

[21] Appl. No.: 09/055,532

[22] Filed: Apr. 6, 1998

[51] Int. Cl.[7] .............................. H03B 25/00; H03L 7/099
[52] U.S. Cl. .................................. 331/25; 331/76; 331/77
[58] Field of Search .................... 331/25, 76, 77

[56] References Cited

U.S. PATENT DOCUMENTS

| | | | |
|---|---|---|---|
| 3,916,335 | 10/1975 | Masson | 331/4 |
| 4,023,108 | 5/1977 | Torii | 331/76 |
| 4,039,968 | 8/1977 | Emshwiller | 331/19 |
| 4,590,513 | 5/1986 | Craft | 331/77 |
| 4,871,984 | 10/1989 | Laton et al. | 331/76 |
| 5,015,971 | 5/1991 | Taylor et al. | 331/16 |
| 5,223,801 | 6/1993 | Bergman | 331/76 |
| 5,302,918 | 4/1994 | Sturzebecher et al. | 331/10 |
| 5,471,652 | 11/1995 | Hulkko | 455/76 |
| 5,521,532 | 5/1996 | Gumm | 327/105 |
| 5,546,088 | 8/1996 | Trummer et al. | 342/124 |

Primary Examiner—Siegfried H. Grimm
Attorney, Agent, or Firm—Terry J. Anderson; Karl J. Hoch, Jr.

[57] ABSTRACT

A method and a stable local oscillator system for providing a signal centered at a frequency of interest to a radio frequency (RF) converter. The method includes the following steps: (a) generating an output signal which comprises a fundamental signal centered at a fundamental frequency and a harmonic signal centered at the frequency of interest which is equal to an integral multiple of the fundamental frequency; (b) amplifying the output signal such that the harmonic signal is amplified more than the fundamental signal; and (c) bandpass filtering the amplified output signal such that the amplified fundamental signal is substantially suppressed and the amplified harmonic signal is used as a local oscillator in the RF converter. An example is given for the case where the fundamental frequency is 1.67 gigahertz (GHz), and the frequency of interest is 3.34 GHz which is the second harmonic.

22 Claims, 1 Drawing Sheet

LOCAL OSCILLATOR SYSTEM USING HARMONIC DERIVED FROM PHASE LOCKED LOOP

FIELD OF THE INVENTION

The present invention relates generally to methods and systems for generating a local oscillator signal for use in a radio frequency converter, and more particularly to a method and a system for providing a stable high-frequency local oscillator signal using inexpensive components.

BACKGROUND OF THE INVENTION

The use of local oscillators in communications systems is well known. A typical wireless communications system consists of a transmitter, a receiver and communication channels wirelessly connecting the receiver to the transmitter. At the transmitter, an information bit sequence is coded and transformed into an analog waveform centered at baseband frequency, which is subsequently up-converted to be centered at a higher frequency in order to be sent over one of a number of predetermined radio frequency (RF) channels. At a given receiver, the RF received signal is down-converted to one or more successive intermediate frequencies (IF) before being converted to baseband frequency in the desired channel. The resulting analog baseband signal is then digitized and demodulated to yield the original information bit sequence. In a standard transceiver, analog local oscillators (LOs) are used to implement each IF down-conversion or up-conversion stage.

Currently, there is an interest in using the less congested 5725 MHz–5850 MHz frequency band for wireless communications. This frequency band, known as the Industrial, Scientific and Medical (ISM) band, is currently unlicensed. To utilize the less congested ISM band with the existing 2400–2488.35 MHz point-to-point radio base station infrastructure requires a radio converter to up-convert the 2400–2488.35 MHz band to the 5725–5850 MHz ISM band and to down-convert the 5725–5850 MHzISM band to the 2400–2488.35 MHz band. This radio converter requires a stable local oscillator with a frequency of about 3.34 gigahertz (GHz). The present invention allows the construction of such a stable local oscillator using existing low-cost components.

SUMMARY OF THE INVENTION

A method and a stable local oscillator system for providing a signal centered at a frequency of interest to a radio frequency (RF) converter are disclosed. The method comprises the following steps: (a) generating an output signal which comprises a fundamental signal centered at a fundamental frequency and a harmonic signal centered at the frequency of interest which is equal to an integral multiple of the fundamental frequency; (b) amplifying the output signal such that the harmonic signal is amplified more than the fundamental signal; and (c) bandpass filtering the amplified output signal such that the amplified fundamental signal is substantially suppressed and the amplified harmonic signal drives the RF converter.

In the preferred embodiment of the invention, the frequency of interest is the second harmonic which is equal to twice the fundamental frequency. An example is given for the case where the fundamental frequency is 1.67 GHz gigahertz (GHz), and the frequency of interest is 3.34 GHz.

The output signal, which includes the fundamental signal and the harmonic signals, is generated by a stable phase locked loop circuit, as follows: (1) generating a voltage-controlled oscillator (VCO) signal which has a first signal centered at the fundamental frequency, a second signal centered at the frequency of interest, and the other integral harmonic frequencies. This output stays locked at the fundamental frequency by a control signal; (2) splitting the VCO signal into two signals which are the output signal and a feedback signal; (3) comparing the frequency of the feedback signal with the frequency of a reference signal to produce an error signal; and (4) lowpass filtering the error signal to produce the control signal which is used for locking the VCO signal at the fundamental frequency.

The reference signal is generated by a stable temperature compensated crystal oscillator, to keep the phase locked loop circuit stable at the fundamental frequency. The phase locked loop circuit must be very stable in order for the amplified harmonic signal, which is generated from the phase locked loop circuit output signal, to be utilized in a RF converter. Specifically, the frequency of the amplified harmonic signal varies less than 2 parts per million (ppm) from +70° C. to −40° C.

The VCO signal is generated by a voltage-controlled oscillator (VCO), and preferably buffered at the output of the VCO to prevent reflected power from causing distortion of the VCO signal.

The VCO signal is then preferably amplified to provide sufficient power to the output signal and the feedback signal.

A low-cost stable local oscillator system which implements the method of the present invention is disclosed. The system comprises: (a) a phase locked loop circuit for generating the output signal which includes the fundamental signal and the harmonic signals; (b) an amplifier for amplifying the output signal, providing more gain at the desired harmonic than at the fundamental frequency resulting in the harmonic signal being amplified more than the fundamental signal; and (c) a bandpass filter having a passband centered about the frequency of interest, substantially suppressing the amplified fundamental signal and higher order harmonics, while passing the desired amplified harmonic signal.

The phase locked loop circuit is comprised of (a) a voltage-controlled oscillator (VCO) for generating a VCO signal which a signal at the fundamental frequency and higher order integer harmonic signals; the VCO receives a control signal which enables the VCO to stay locked at the fundamental frequency; (b) a signal splitter for splitting the VCO signal into two signals which are the phase locked loop circuit output signal and a feedback signal, each of the two signals comprises a component centered at the fundamental frequency and a component centered at the desired harmonic; (c) a phase detector for comparing the feedback signal with a reference signal and producing an error signal; and (d) a lowpass filter for filtering the error signal and producing the control signal for the VCO.

The phase locked loop circuit also includes a temperature compensated crystal oscillator (TCXO) which provides the reference signal to the phase detector. This stable TCXO keeps the phase locked loop circuit stable. In the preferred embodiment of the invention, the TCXO is stable for the temperature range from −40° C. to +70° C.

The phase locked loop circuit preferably includes an attenuator located at the output of the VCO to attenuate the power of the VCO signal in order to prevent reflected power from causing distortion of the VCO signal.

The phase locked loop circuit preferably includes a second amplifier located between the attenuator and the signal splitter to amplify the attenuated VCO signal to provide sufficient power to the phase locked loop circuit output signal and the feedback signal.

In the preferred embodiment of the invention, the stable local oscillator system further includes a highpass filter located between the phase locked loop circuit output and the amplifier. This second highpass filter processes the phase locked loop circuit output signal such that the fundamental signal is partially attenuated while the harmonic signal is not attenuated. This highpass matching network allows the use of a low cost amplifier for further processing of the phase locked loop circuit output signal.

Thus, by using selective amplification and filtering, the present invention extracts a normally unused harmonic signal embedded in the VCO signal as the desired frequency signal for use as a local oscillator in a RF converter. For example, to convert the 5725–5850 MHz band to the 2400–2480 MHz band, a RF converter would require a local oscillator with a frequency of about 3.34 GHz. Currently, there is no commercially available 3.34 GHz phase detector chip. Using the present invention, a low-cost stable 3.34 GHz local oscillator can be constructed with a commercially available 2.8 GHz phase detector chip. Other components in the system of the present invention are also commercially available, thus need not be customized.

These, as well as other advantages of the present invention will be more apparent from the following description and drawings. It is understood that changes in the specific structure shown and described may be made within the scope of the claims without departing from the spirit of the invention.

DETAILED DESCRIPTION OF THE INVENTION

Figure 1:
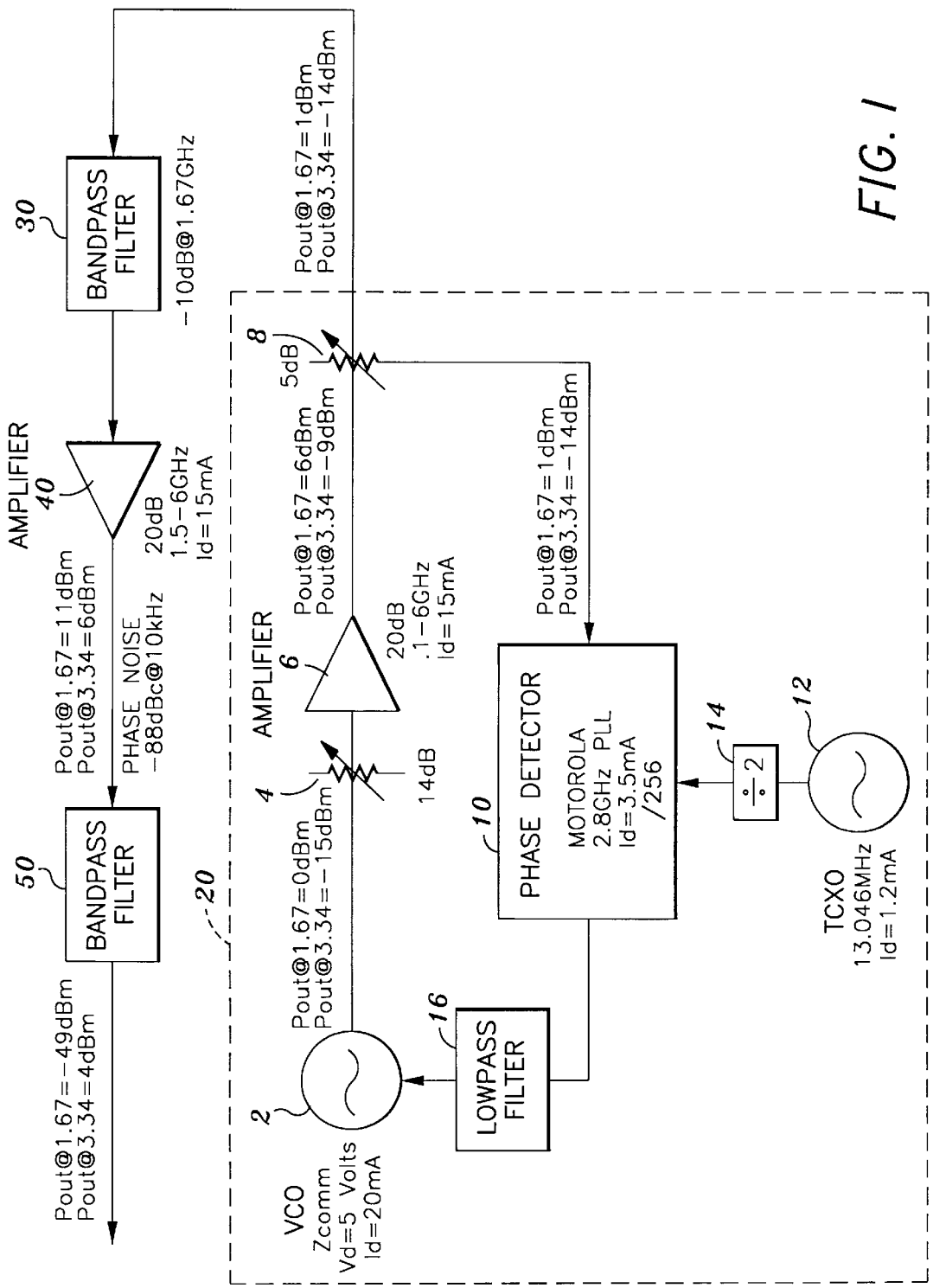
FIG. 1 shows a block diagram of the synthesized stable local oscillator of the present invention.

The detailed description set forth below in connection with the appended drawings is intended as a description of the presently preferred embodiment of the invention, and is not intended to represent the only form in which the present invention may be constructed or utilized. The description sets forth the functions and the sequence of the steps for constructing and operating the invention in connection with the illustrated embodiment. It is to be understood, however, that the same or equivalent functions may be accomplished by different embodiments that are also intended to be encompassed within the spirit and scope of the invention.

FIG. 1 shows the block diagram of the synthesized stable local oscillator of the present invention. As illustrated, the system is constructed as to provide a local oscillator signal centered at 3.34 GHz.

The system comprises a phase locked loop circuit 20, an amplifier 40 and a bandpass filter 50. The system also includes an optional pre-amplifier highpass filter 30.

The phase locked loop circuit 20 generates an output signal which includes the fundamental signal centered at 1.67 GHz and the second harmonic signal centered at 3.34 GHz. The amplifier 40 selectively amplifies the second harmonic signal by providing more gain at the harmonic of 3.34 GHz than at the fundamental frequency of 1.67 GHz. This results in making the desired harmonic signal more prominent with respect to the fundamental signal. The bandpass filter 50, which has a passband centered about the second harmonic, significantly suppresses the amplified fundamental signal and outputs only the amplified harmonic signal. The bandpass filter 50 also suppresses other undesired harmonics.

Optionally, the pre-amplifier highpass filter 30 can be used to attenuate the fundamental signal without attenuating the harmonic signal. This matching network would allow the use of a low-cost amplifier as amplifier 40.

For example, in an implementation of the present invention, the pre-amplifier highpass filter 30 attenuates the fundamental signal by 10 dB without attenuating the harmonic signal or the higher order harmonics. The power of the output signal of the phase locked loop 20 is 1 dBm at 1.67 GHz and –14 dBm at 3.34 GHz. The filter 30 output signal power is then –9 dBm at 1.67 GHz and –14 dBm at 3.34 GHz. Using a low-cost amplifier having a gain of 20 dB in the frequency range of 1.5 GHz to 6 GHz as amplifier 40, the amplifier 40 output signal power is 11 dBm at 1.67 GHz and 6 dBm at 3.34 GHz. At 3.34 GHz, the amplifier 40 output signal phase noise is –88 dBc/Hz at 10 kHz offset. The bandpass filter 50 provides a minimum attenuation of –60 dB at the fundamental, 3rd harmonic and above while achieving a low insertion loss of –2 dB at 3.34 GHz. The bandpass filter 50 output signal power is –49 dBm at 1.67 GHz and 4 dBm at 3.34 GHz. The bandpass filter 50 output signal is very stable (its frequency varies less than 2 ppm), thus can be used as a local oscillator signal for a radio converter.

Referring to FIG. 1, the phase locked loop circuit comprises a voltage-controlled oscillator (VCO) 2, an attenuator 4, an amplifier 6, a signal splitter 8, a phase detector 10, a temperature compensated crystal oscillator (TCXO) 12, a frequency divider 14, and a lowpass filter 16.

The voltage-controlled oscillator 2 generates a VCO signal. Due to the non-linearity of the VCO 2, the VCO signal includes, in addition to the fundamental signal centered at the fundamental frequency of 1.67 GHz, other harmonics, including the second harmonic centered at the second harmonic of 3.34 GHz. In the illustrated example, the VCO signal power is 0 dBm at 1.67 GHz, and –15 dBm at 3.34 GHz (where dBm represents the absolute power relative to milliwatts, e.g., 0 dBm represents 1 mW, and –15 dBm represents 0.0316 mW). The VCO 2 receives as input a control signal from the lowpass filter 16 which makes the VCO 2 stay locked at the fundamental frequency of 1.67 GHz.

The attenuator 4 is located at the output of the VCO 2 to attenuate the power of the VCO signal in order to prevent reflected power from causing distortion of the VCO signal. In the example, this attenuator 4 attenuates the power of the VCO output signal by 14 dB. Thus, at the output of the attenuator 4, the VCO signal power is –14 dBm at 1.67 GHz, and –29 dBm at 3.34 GHz. The attenuator 4 is advisable with currently available VCOs, and may not be needed with better VCOs.

The amplifier 6, located between the attenuator 4 and the signal splitter 8, amplifies the attenuated VCO signal to provide sufficient power to split between the phase locked loop circuit output signal and a feedback signal. The feedback signal, which is inputted into the phase detector 10, must have enough power for the phase locked loop 20 to establish phase locking at the fundamental frequency of 1.67 GHz. In the example, the amplifier is a commercially available type which has a gain of 20 dB in the range of 0.1 GHz to 6 GHz. The amplifier 6 output signal power is 6 dBm at 1.67 GHZ, and –9 dBm at 3.34 GHz.

The signal splitter 8 divides the power of the amplifier 6 output signal into two parts to form two signals: the phase locked loop circuit 20 output signal and the feedback signal. In the example, the two signals are equal in power. The signal splitter 8 causes some signal power loss, represented by 5 dBm attenuation in FIG. 1. The power of each of the two splitter output signals is 1 dBm at 1.67 GHz, and −14 dBm at 3.34 GHz.

The phase detector 10 receives the feedback signal at its input. Inside the phase detector 10, there is a prescaler which divides the fundamental frequency of the feedback signal by a large integer in order to scale it down for comparison with the frequency of a reference signal. In the example, the fundamental frequency of 1.67 GHz is divided by 256 to be compared with the reference frequency of 6.523 MHz. The phase detector chip may be implemented by any of a number of commercially available PPL chips, such as the 2.8 GHz PPL chip marketed by Motorola, Inc.

The temperature compensated crystal oscillator (TCXC) 12 provides the reference signal to the phase detector. The stable TCXO 12 keeps the phase locked loop circuit 20 stable, i.e., phase locked at the fundamental frequency. Since it is less expensive to use a commercially available component, a 13.046 MHz TCXO is used as the source of the reference signal. Since a 6.523 MHz signal is needed as the reference signal, the TCXO 12 output is processed by the frequency divider 14 to produce the reference signal. The frequency divider 14 in effect halves the frequency of the TCXO 12 output signal to obtain a 6.523 MHz signal. In this implementation of the invention, the TCXO is stable for the temperature range from −30° C. to +70° C.

Let $f_o$ denote the frequency obtained by dividing the fundamental frequency of the feedback signal, which is nominally 1.67 GHz, by 256. Let $f_r$ denote the frequency of the reference signal, i.e., 6.523 MHz. The phase detector 10 compares $f_o$ with $f_r$ and produces an error signal. The error signal contains components at the frequencies $256*|f_o-f_r|$ and $256(f_o+f_r)$.

The lowpass filter 16 receives the error signal from the phase detector 10, suppresses the signal component at frequency $256(f_o+f_r)$ and other high frequency components, and passes the low frequency component at $256*|f_o-f_r|$. If $256*f_o$ does not deviate from its nominal value of 1.67 GHz, then the low frequency component at $256*|f_o-f_r|$ is just a constant. The lowpass filter 16 output is proportional to the instantaneous frequency deviation of the feedback signal which is inputted into the phase detector 10, and serves as the control signal for the VCO 2. This control signal shifts the VCO 2 fundamental frequency from $256*f_o$ to $256*f_r$ so that the VCO 2 remains synchronized with the reference signal from the TCXO 12 and stays locked at the fundamental frequency of 1.67 GHz.

It is understood that the exemplary stable local oscillator system described herein and shown in the drawing represents only a presently preferred embodiment of the invention. Indeed, various modifications and additions may be made to such embodiment without departing from the spirit and scope of the invention. For example, the frequency of interest needs not be the second harmonic as illustrated. Those skilled in the art will recognize that various other configurations are equivalent and therefore likewise suitable. Thus, these and other modifications and additions may be obvious to those skilled in the art and may be implemented to adapt the present invention for use in a variety of different applications.

What is claimed is:

1. A method for providing a signal centered at a frequency of interest to a radio frequency (RF) converter, the method comprising the steps of:

(a) generating a voltage-controlled oscillator (VCO) signal, the VCO signal comprising a first signal centered at a fundamental frequency and a second signal centered at the frequency of interest, the VCO signal staving locked at the fundamental frequency by a control signal;

(b) splitting the VCO signal into an output signal and a feedback signal;

(c) comparing the frequency of the feedback signal with the frequency of a reference signal to produce an error signal;

(d) lowpass filtering the error signal to produce said control signal (e) attenuating power of the VCO signal to prevent distortion of the VCO signal;

(f) generating said output signal from the attenuated VCO signal, the output signal comprising a fundamental signal centered at the fundamental frequency and a harmonic signal centered at the frequency of interest, the frequency of interest being equal to an integral multiple of the fundamental frequency, the fundamental signal having larger power than the harmonic signal;

(g) amplifying the output signal such that the fundamental signal and the harmonic signal are amplified unequally, resulting in the desired harmonic signal being selectively amplified more than the fundamental signal; and (h) bandpass filtering the amplified output signal such that the amplified fundamental signal and all undesired harmonics are substantially suppressed while the amplified desired harmonic signal is communicated to the RF converter.

2. The method as recited in claim 1 wherein the frequency of interest is equal to twice the fundamental frequency.

3. The method as recited in claim 1 wherein the fundamental signal and the harmonic signal are generated by a stable phase locked loop circuit.

4. The method as recited in claim 1 wherein said reference signal is generated by a temperature compensated crystal oscillator.

5. The method as recited in claim 1 further comprises the step of amplifying said attenuated VCO signal.

6. The method as recited in claim 1 wherein the fundamental frequency is 1.67 gigahertz, and the frequency of interest is 3.34 gigahertz.

7. A low-cost stable local oscillator system for providing a signal centered at a frequency of interest to a radio frequency (RF) convert, the system comprising:

(a) a phase locked loop circuit for generating an output signal, said output signal comprising a fundamental signal centered at a fundamental frequency and a harmonic signal centered at the frequency of interest, the frequency of interest being equal to an integral multiple of the fundamental frequency, the fundamental signal having larger power than the harmonic signal, wherein the phase locked loop circuit includes:

(i) a voltage-controlled oscillator (VCO) for generating a VCO signal, the VCO signal comprising a first signal centered at the fundamental frequency, a second signal centered at the frequency of interest, and other integral harmonics, the VCO receiving a control signal, said control signal facilitating the VCO to stay locked at the fundamental frequency;

(ii) an attenuator in electrical communication with the VCO, said attenuator attenuating power of the VCO signal to prevent pulling of the VCO signal;

(iii) a signal splitter, in electrical communication with the attenuator, for splitting the attenuated VCO signal into said phase locked loop circuit output signal and a feedback signal, the phase locked loop circuit output signal comprising said fundamental frequency, integral harmonic frequencies, and said harmonic signal centered at the frequency of interest;

(iv) a phase detector, in electrical communication with the signal splitter to receive the feedback signal, the phase detector comparing the feedback signal with a reference signal and producing an error signal; and (v) a lowpass filter, in electrical communication with the phase detector to receive the error signal, the lowpass filter filtering the error signal and producing said control signal;

(b) an amplifier in electrical communication with the phase locked loop circuit to receive said output signal, the amplifier amplifying said output signal, the amplifier providing more gain at the frequency of interest than at the fundamental frequency resulting in the harmonic signal being amplified more than the fundamental signal; and (c) a bandpass filter in electrical communication with the amplifier to receive the amplified output signal, the amplified output signal comprising the amplified fundamental signal and the amplified harmonic signal, the bandpass filter having a passband centered about the frequency of interest, the bandpass filter substantially suppressing the amplified fundamental signal and passing the amplified harmonic signal.

8. The stable local oscillator system as recited in claim 7 wherein the phase locked loop circuit further comprises a temperature compensated crystal oscillator (TCXO) in electrical communication with the phase detector, the TCXO providing said reference signal to the phase detector.

9. The stable local oscillator system as recited in claim 7 wherein the phase locked loop circuit further comprises a second amplifier located between the attenuator and the signal splitter, said second amplifier amplifying the attenuated VCO signal and transferring the resulting amplified VCO signal to the signal splitter.

10. The stable local oscillator system as recited in claim 7 further comprises a highpass filter located between the phase locked loop circuit and the amplifier, said highpass filter filtering the phase locked loop circuit output signal such that the fundamental signal is partially attenuated and the harmonic signal is approximately unattenuated, and communicating the resulting filtered phase locked loop circuit output signal to the amplifier.

11. The stable local oscillator system as recited in claim 7 wherein the fundamental frequency is 1.67 gigahertz, and the frequency of interest is 3.34 gigahertz.

12. A low-cost stable local oscillator system for providing a signal centered at a frequency of interest to a radio frequency (RF) converter, the system comprising:

(a) a phase locked loop circuit for generating an output signal, said phase locked loop circuit having a voltage-controlled oscillator (VCO) for generating a VCO signal and an attenuator in electrical communication with the VCO to attenuate power of a VCO signal and prevent pulling thereof, said output signal generated from the attenuated VCO signal and comprising a fundamental signal centered at a fundamental frequency and a harmonic signal centered at the frequency of interest, the frequency of interest being equal to an integral multiple of the fundamental frequency, the fundamental signal having larger power than the harmonic signal;

(b) an amplifier in electrical communication with the phase locked lop circuit to receive said output signal, the amplifier amplifying said output signal, the amplifier providing more gain at the frequency of interest than at the fundamental frequency resulting in the harmonic signal being amplified more than the fundamental signal; and (c) a bandpass filter in electrical communication with the amplifier to receive the amplified output signal, the amplified output signal comprising the amplified fundamental signal and the amplified harmonic signal, the bandpass filter having a passband centered about the frequency of interest, the bandpass filter substantially suppressing the amplified fundamental signal and passing the amplified harmonic signal.

13. The stable local oscillator system as recited in claim 12 wherein the phase locked loop circuit further comprises:

(a) a signal splitter in electrical communication with the VCO, for splitting the VCO signal into said phase locked loop circuit output signal and a feedback signal, the phase locked loop circuit output signal comprising said fundamental signal centered at the fundamental frequency, integral harmonic frequencies, and said harmonic signal centered at the frequency of interest;

(b) a phase detector, in electrical communication with the signal splitter to receive the feedback signal, the phase detector comparing the feedback signal with a reference signal and producing an error signal; and (c) a lowpass filter, in electrical communication with the VCO and the phase detector to receive the error signal, the lowpass filter filtering the error signal and producing a control signal to the VCO in order to facilitate the VCO to stay locked at the fundamental frequency.

14. The stable local oscillator system as recited in claim 13 wherein the phase locked loop circuit further comprises a temperature compensated crystal oscillator (TCXO) in electrical communication with the phase detector, the TCXO providing said reference signal to the phase detector.

15. The stable local oscillator system as recited in claim 13 wherein the phase locked loop circuit further comprises a second amplifier located between the attenuator and the signal splitter, said second amplifier amplifying the attenuated VCO signal and transferring the resulting amplified VCO signal to the power splitter.

16. The stable local oscillator system as recited in claim 12 further comprising a highpass filter located between the phase locked loop circuit and the amplifier, said highpass filter filtering the phase locked loop circuit output signal such that the fundamental signal is partially attenuated and the harmonic signal is approximately unattenuated, and communicating the resulting filtered phase locked loop circuit output signal to the amplifier.

17. The stable local oscillator system as recited in claim 12 wherein the fundamental frequency is 1.67 gigahertz, and the frequency of interest is 3.34 gigahertz.

18. A method for providing a signal centered at a frequency of interest to a radio frequency (RF) converter, the method comprising the steps of:

(a) generating a voltage-controlled oscillator (VCO) signal;

(b) attenuating the power of the VCO signal to prevent distortion thereof;

(c) generating an output signal from the attenuated VCO signal, the output signal comprising a fundamental signal centered at a fundamental frequency and a harmonic signal centered at the frequency of interest, the frequency of interest being equal to an integral multiple of the fundamental frequency, the fundamental signal having larger power than the harmonic signal;

(d) amplifying the output signal such that the fundamental signal and the harmonic signal are amplified unequally, resulting in the desired harmonic signal being selectively amplified more than the fundamental signal; and (e) bandpass filtering the amplified output signal such that the amplified fundamental signal and all undesired harmonics are substantially suppressed while the amplified desired harmonic signal is communicated to the RF converter.

19. The method as recited in claim 18 wherein the frequency of interest is equal to twice the fundamental frequency.

20. The method as recited in claim 18 wherein the VCO signal is generated by a stable phase locked loop circuit.

21. The method as recited in claim 18 further comprising the step of amplifying the attenuated VCO signal.

22. The method as recited in claim 18 wherein the fundamental frequency is 1.67 gigahertz, and the frequency of interest is 3.34 gigahertz.

* * * * *